United States Patent
Kimman et al.

(10) Patent No.: US 11,029,612 B2
(45) Date of Patent: Jun. 8, 2021

(54) BEARING DEVICE, MAGNETIC GRAVITY COMPENSATOR, VIBRATION ISOLATION SYSTEM, LITHOGRAPHIC APPARATUS, AND METHOD TO CONTROL A GRAVITY COMPENSATOR HAVING A NEGATIVE STIFFNESS

(71) Applicant: ASML NETHERLANDS B.V., Veldhoven (NL)

(72) Inventors: Maarten Hartger Kimman, Veldhoven (NL); Hans Butler, Best (NL); Olof Martinus Josephus Fischer, Veldhoven (NL); Christiaan Alexander Hoogendam, Westerhoven (NL); Theodorus Mattheus Joannus Maria Huizinga, Eindhoven (NL); Johannes Marinus Maria Rovers, Eindhoven (NL); Eric Pierre-Yves Vennat, Veldhoven (NL); Maurice Willem Jozef Etienne Wijckmans, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/494,200

(22) PCT Filed: Feb. 15, 2018

(86) PCT No.: PCT/EP2018/053808
§ 371 (c)(1),
(2) Date: Sep. 13, 2019

(87) PCT Pub. No.: WO2018/166745
PCT Pub. Date: Sep. 20, 2018

(65) Prior Publication Data
US 2020/0049203 A1    Feb. 13, 2020

(30) Foreign Application Priority Data

Mar. 16, 2017  (EP) ..................................... 17161329
May 23, 2017  (EP) ..................................... 17172365
(Continued)

(51) Int. Cl.
*G03F 7/20*       (2006.01)
*F16C 39/06*      (2006.01)

(52) U.S. Cl.
CPC ........ *G03F 7/70816* (2013.01); *F16C 39/063* (2013.01); *G03F 7/709* (2013.01);
(Continued)

(58) Field of Classification Search
CPC ............. G03F 7/70716; G03F 7/70725; G03F 7/70758; G03F 7/70766; G03F 7/70775;
(Continued)

(56) References Cited

U.S. PATENT DOCUMENTS 9,519,230 B2   12/2016   Boon et al.
9,535,340 B2   1/2017    Boon et al.
(Continued)

FOREIGN PATENT DOCUMENTS

CN    103034065 B    12/2014
DE    102014005547 A1    10/2015
(Continued)

OTHER PUBLICATIONS

International Search Report and Written Opinion of the International Searching Authority directed to related International Patent Application No. PCT/EP2018/053808, dated Aug. 3, 2018; 16 pages.
(Continued)

*Primary Examiner* — Christina A Riddle
(74) *Attorney, Agent, or Firm* — Sterne, Kessler, Goldstein & Fox P.L.L.C.

(57) ABSTRACT

The invention relates to a bearing device arranged to support in a vertical direction a first part of an apparatus with respect
(Continued)

to a second part of the apparatus, comprising a magnetic gravity compensator. The magnetic gravity compensator comprises: a first permanent magnet assembly mounted to one of the first part and the second part and comprising at least a first column of permanent magnets, the first column extending in the vertical direction, wherein the permanent magnets have a polarization direction in a first horizontal direction or in a second horizontal direction opposite to the first horizontal direction, wherein vertically adjacent permanent magnets have opposite polarization directions, a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction, wherein the first permanent magnet assembly at least partially encloses the second permanent magnet assembly.

18 Claims, 10 Drawing Sheets

(30) Foreign Application Priority Data

Sep. 11, 2017 (EP) .................................... 17190344
Nov. 9, 2017 (EP) .................................... 17200742

(52) U.S. Cl.
CPC ...... *G03F 7/70758* (2013.01); *G03F 7/70825* (2013.01); *G03F 7/70833* (2013.01)

(58) Field of Classification Search
CPC .. G03F 7/70783; G03F 7/708; G03F 7/70808; G03F 7/70816; G03F 7/70825; G03F 7/70833; G03F 7/7085; G03F 7/709; G03F 7/7095; G03F 7/70858; F16C 39/063; F16C 39/06; F16C 39/066
USPC .......................................... 355/52–55, 67–77
See application file for complete search history.

(56) References Cited

U.S. PATENT DOCUMENTS

| 2003/0052284 | A1  | 3/2003  | Hol et al. |
| 2005/0002008 | A1  | 1/2005  | De Weerdt et al. |
| 2009/0122284 | A1  | 5/2009  | Butler et al. |
| 2013/0299290 | A1* | 11/2013 | Janssen ................... F16F 15/03 188/267 |
| 2014/0185029 | A1* | 7/2014  | Kwan ................... G03F 7/7015 355/72 |
| 2015/0212430 | A1  | 7/2015  | Boon et al. |

FOREIGN PATENT DOCUMENTS

| EP | 1265105 A2    | 12/2002 |
| EP | 1475669 A1    | 11/2004 |
| JP | H11325075 A   | 11/1999 |
| WO | 2006046101 A1 | 5/2006  |
| WO | 2014009042 A1 | 1/2014  |
| WO | 2014012729 A1 | 1/2014  |
| WO | 2014044496 A2 | 3/2014  |

OTHER PUBLICATIONS

International Preliminary Report on Patentability directed to related International Patent Application No. PCT/EP2018/053808, dated Sep. 17, 2019; 11 pages.

* cited by examiner

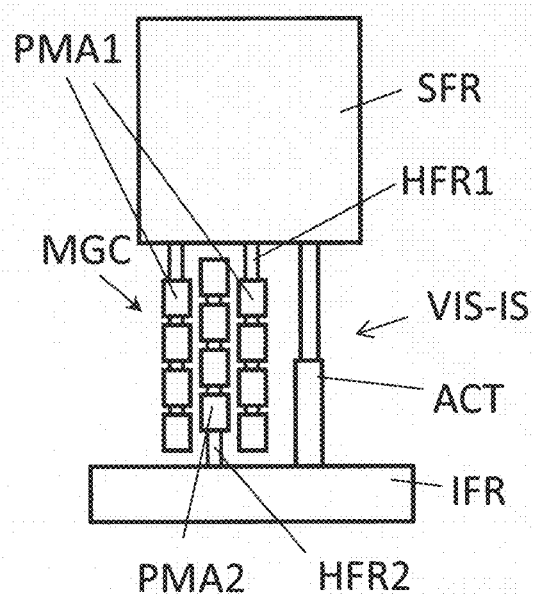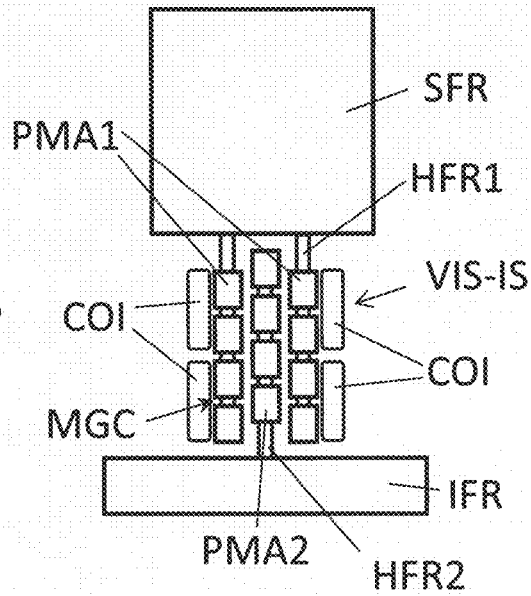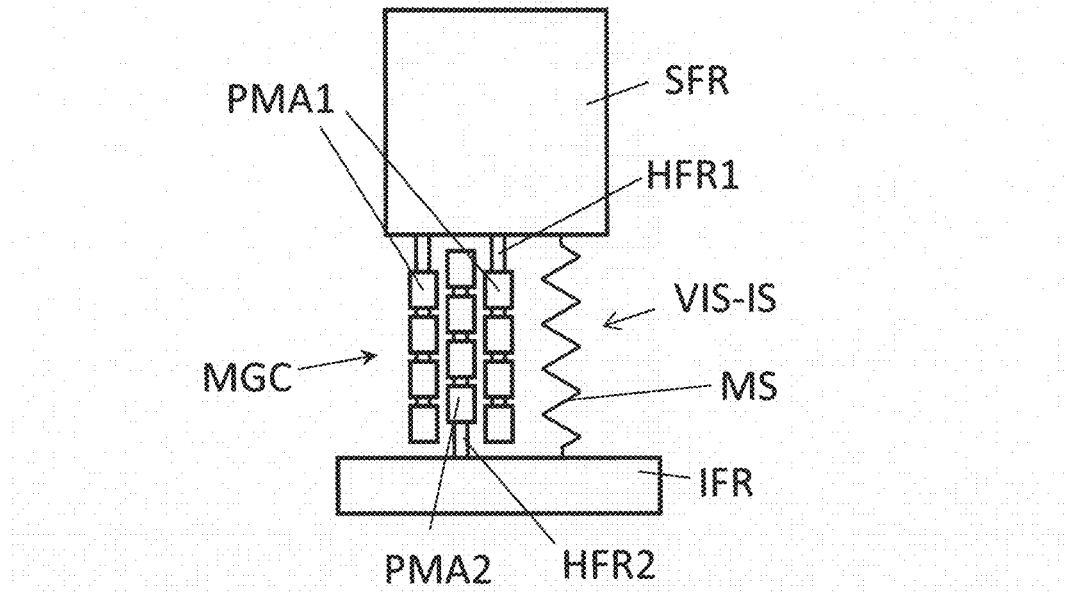

Figure 13
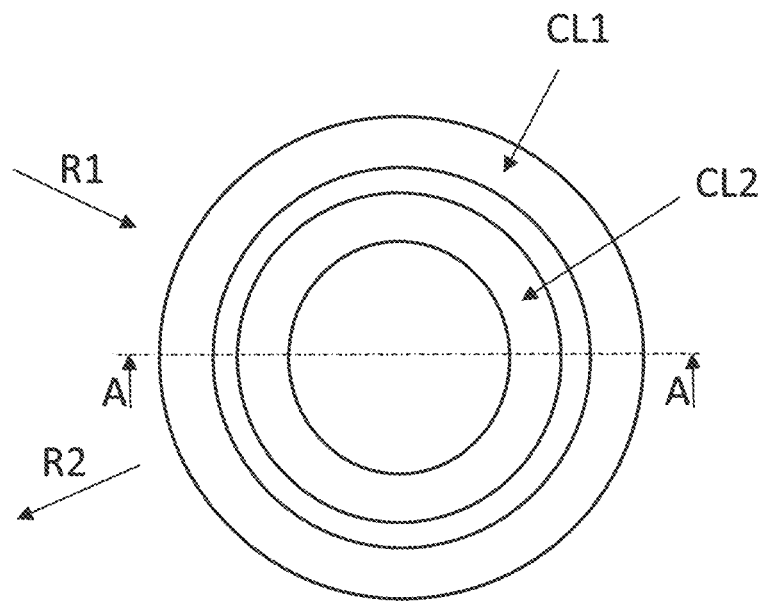
Figure 14 (A-A)
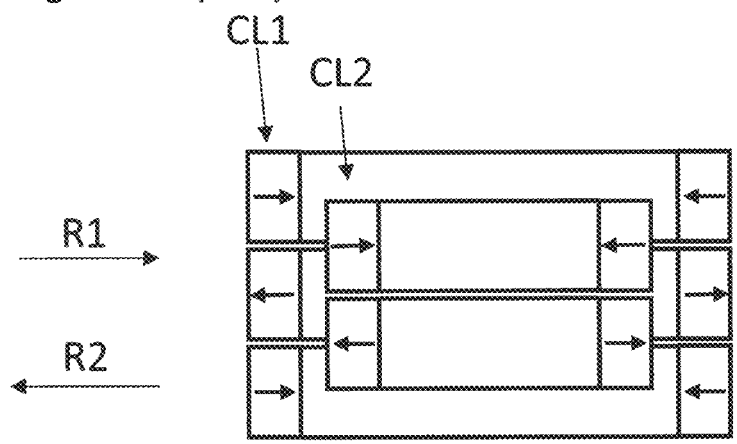

Figure 15
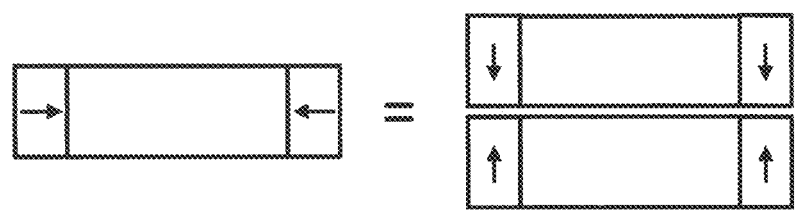
Figure 16
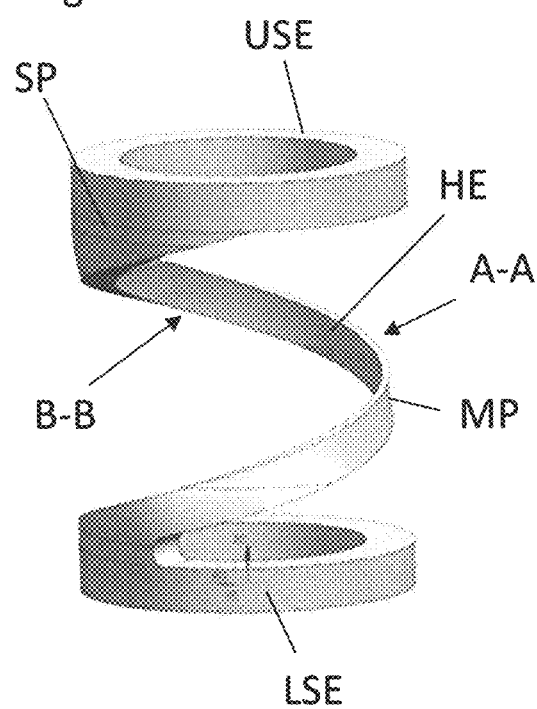
Figure 17 (A-A)
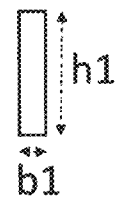
Figure 18 (B-B)
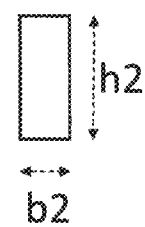

BEARING DEVICE, MAGNETIC GRAVITY COMPENSATOR, VIBRATION ISOLATION SYSTEM, LITHOGRAPHIC APPARATUS, AND METHOD TO CONTROL A GRAVITY COMPENSATOR HAVING A NEGATIVE STIFFNESS

CROSS-REFERENCE TO RELATED APPLICATIONS

This application is a 35 U.S.C. 371 National Phase of PCT Application No. PCT/EP2018/053808, filed on Feb. 15, 2018, which claims priority of EP application 17161329.2 which was filed on Mar. 16, 2017 and EP application 17172365.3 which was filed on May 23, 2017 and EP application 17190344.6 which was filed on Sep. 11, 2017 and EP application 17200742.9 which was filed on Nov. 9, 2017 and are all incorporated herein in its entirety by reference.

FIELD OF THE INVENTION

The present invention relates to a bearing device, a magnetic gravity compensator, a vibration isolation system, a lithographic apparatus comprising such bearing device and a method to control a gravity compensator having a negative stiffness. The invention further relates to a spring to support a mass with respect to a support.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, vibration isolation systems are used to support a first part of the lithographic apparatus with respect to a second part, while at the same time transfer of vibrations from the second part of the lithographic apparatus to the first part of the lithographic apparatus, or vice versa, are prevented or at least minimized. Examples of vibration isolation systems are for example air mounts.

An example of a structure in which a vibration isolation system may be used is the support structure for a mirror element of a projection system, e.g. a projection optics box, of a lithographic apparatus and/or for one or more sensors configured to determine a position of such mirror element. It is of importance that vibrations, for instance originating from a floor surface of a factory, are not transferred to the mirror elements of the projection system or its associated sensors, since this would negatively influence the lithographic process, for example the overlay or focus.

The dynamic architecture of the support structure may be designed as follows. A base frame is arranged on a floor surface and supports a force frame supporting the mirror device. One or more vibration isolation systems comprising an air mount is arranged between the base frame and the force frame to at least partly isolate the force frame from vibrations of the base frame. Further, the base frame supports an intermediate frame that in its turn supports a sensor frame. Also between the base frame and the intermediate frame one or more vibration isolation systems comprising an air mount may be provided.

To optimize the sensor performance of a sensor mounted on the sensor frame, it is advantageous to provide one or more vibration isolation systems between the intermediate frame and the sensor frame. In some embodiments of a support structure for a mirror element, the vibration isolation between the sensor frame and the intermediate frame may require a mechanical cut-off frequency of 2 Hz. Due to the low modal mass caused by the relatively light-weight intermediate frame, a relatively low stiffness of the vibration isolation system of for example 1e4 to 1e3 N/m may be required. Further, the sensor frame may have a relatively high mass of for example at least 2000 kg, for example 2800 kg that is supported by one or more vibration isolation systems. In an embodiment four vibration isolation systems are provided, each arranged at or close to a corner of the sensor frame. The combination of the low stiffness and the high mass of the part of the sensor frame carried by a single vibration isolation system of for example at least 500 kg, for instance 700 kg, requires a challenging design of the vibration isolation system.

In some embodiments of a lithographic apparatus this vibration isolation should be provided in a vacuum environment. In such vacuum environment an air mount cannot be used. State of the art vibration isolation systems that can be used in a vacuum environment do not provide the required performance.

SUMMARY OF THE INVENTION

It is an object of the invention to provide a bearing device that can support a relatively large mass, but at the same time has a low stiffness. It is a further object of the invention to provide a magnetic gravity compensator and a vibration isolation system comprising such bearing device.

According to an aspect of the invention, there is provided a bearing device arranged to support in a vertical direction a first part of an apparatus with respect to a second part of the apparatus, comprising a magnetic gravity compensator, wherein the magnetic gravity compensator comprises:

a first permanent magnet assembly mounted to one of the first part and the second part and comprising at least a first column of permanent magnets, the first column extending in the vertical direction, wherein the permanent magnets have a polarization direction in a first horizontal direction or in a second horizontal direction opposite to the first horizontal direction, wherein vertically adjacent permanent magnets have opposite polarization directions, a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction, wherein the first permanent magnet assembly at least partially encloses the second permanent magnet assembly.

According to an aspect of the invention, there is provided a magnetic gravity compensator, comprising:

a first permanent magnet assembly mounted to one of the first part and the second part and comprising at least a first column of permanent magnets, the first column extending in the vertical direction, wherein the permanent magnets have a polarization direction in a first horizontal direction or in a second horizontal direction opposite to the first horizontal direction, wherein vertically adjacent permanent magnets have opposite polarization directions, a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction, wherein the first permanent magnet assembly at least partially encloses the second permanent magnet assembly.

According to an aspect of the invention, there is provided a vibration isolation system comprising a bearing device arranged to support in a vertical direction a first part of an apparatus with respect to a second part of the apparatus, comprising a magnetic gravity compensator, wherein the magnetic gravity compensator comprises:

a first permanent magnet assembly mounted to one of the first part and the second part and comprising at least a first column of permanent magnets, the first column extending in the vertical direction, wherein the permanent magnets have a polarization direction in a first horizontal direction or in a second horizontal direction opposite to the first horizontal direction, wherein vertically adjacent permanent magnets have opposite polarization directions, a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction, wherein the first permanent magnet assembly at least partially encloses the second permanent magnet assembly.

According to an aspect of the invention, there is provided a lithographic apparatus comprising: a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

wherein the lithographic apparatus comprises a bearing device arranged to support in a vertical direction a first part of the lithographic apparatus with respect to a second part of the lithographic apparatus, wherein the bearing device comprises a magnetic gravity compensator, wherein the magnetic gravity compensator comprises:

a first permanent magnet assembly mounted to one of the first part and the second part and comprising at least a first column of permanent magnets, the first column extending in the vertical direction, wherein the permanent magnets have a polarization direction in a first horizontal direction or in a second horizontal direction opposite to the first horizontal direction, wherein vertically adjacent permanent magnets have opposite polarization directions, a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction, wherein the first permanent magnet assembly at least partially encloses the second permanent magnet assembly.

According to an aspect of the invention, there is provided a method to control a gravity compensator having a negative stiffness, and arranged between a first part of an apparatus and a second part of the apparatus, using a control system comprising:

a first sensor to provide a first measurement signal representative for a relative distance between the first part of the apparatus and the second part of the apparatus, a second sensor to provide a second measurement signal representative for an acceleration of the first part of the apparatus, and a controller comprising a first sub-controller arranged to receive the first measurement signal and a second sub-controller to receive the second measurement signal, the controller being arranged to provide an actuator signal to drive an actuator device between the first part of the apparatus and the second part of the apparatus on the basis of the first measurement signal and the second measurement signal, wherein the first sub-controller is mainly arranged to add stiffness to the bearing device, therewith allowing a resonance, and wherein the second sub-controller is arranged to damp this resonance.

According to an aspect of the invention, there is provided a spring to support a mass in a support direction with respect to a support, wherein the spring comprises a first support element, a second support element and one or more helix elements extending substantially helically between the first support element and the second support element, wherein one of the first support element and the second support element is connected or to be connected to the mass, wherein the other of the first support element and the second support element is connected or to be connected to the support, wherein a cross section of each of the one or more helix elements decreases from the first support element towards a midpoint of the helix element and increases from the midpoint towards the second support element, wherein the midpoint is halfway between the second support element and the first support element.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 shows a first embodiment of the vibration isolation system of FIG. 2;

FIG. 6 shows a second embodiment of the vibration isolation system of FIG. 2;

FIG. 7 shows a third embodiment of the vibration isolation system of FIG. 2;

FIG. 13 shows a top view of a magnetic gravity compensator according to a further alternative embodiment of the invention;

FIG. 14 shows a cross-section A-A of the magnetic gravity compensator of FIG. 13;

FIG. 15 shows schematically the equivalency between a magnetic ring with a radially inwards polarization direction, and two magnetic rings having opposed longitudinal polarization directions FIG. 16 shows an embodiment of a spring according to an aspect of the invention;

FIG. 17 shows a first cross-section A-A of the spring of FIG. 16;

FIG. 18 shows a second cross-section B-B of the spring of FIG. 16; and

DETAILED DESCRIPTION

Figure 1:
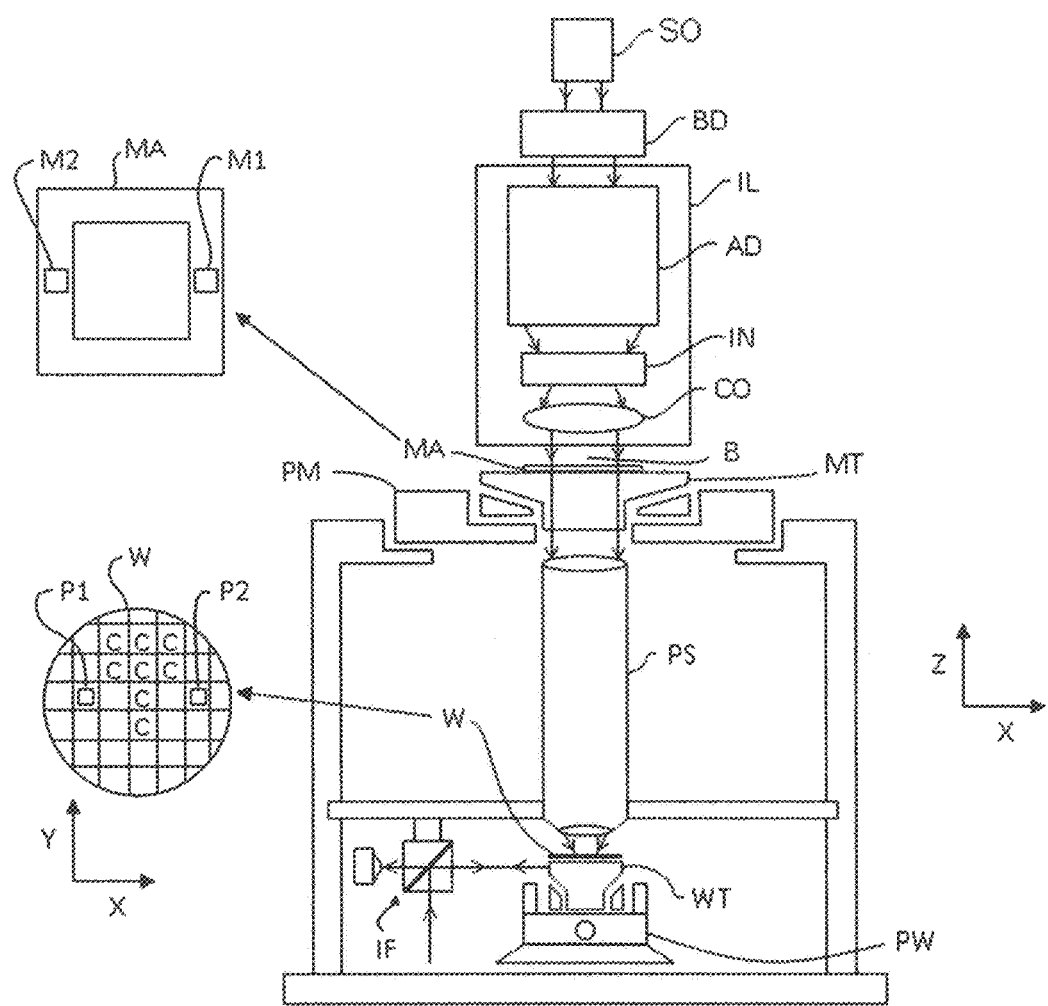
FIG. 1 depicts a lithographic apparatus in which embodiments of the invention may be provided.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam B in different directions. The tilted mirrors impart a pattern in a radiation beam B which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing minors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
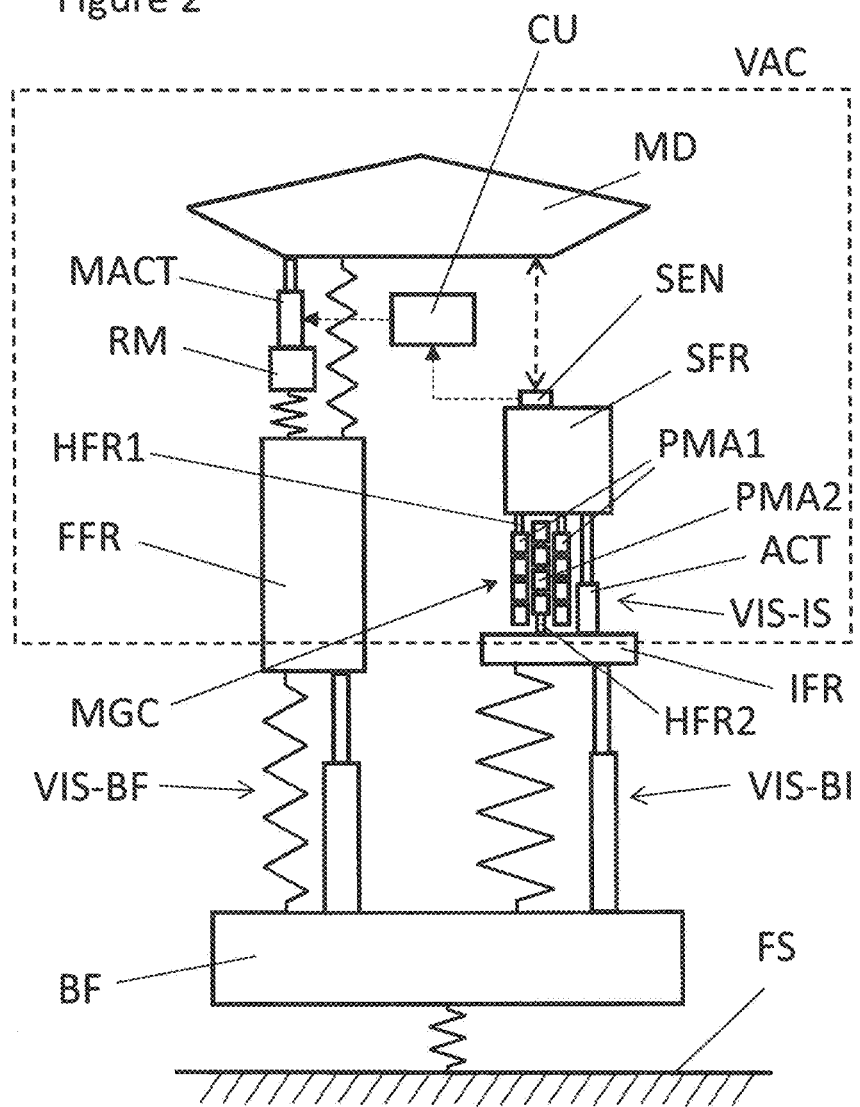
FIG. 2 shows schematically a support structure for a mirror device of a lithographic apparatus, comprising an embodiment of a vibration isolation system according to the invention.

FIG. 2 shows schematically a support structure for a mirror device MD of a lithographic apparatus and one or more sensors SEN to determine a position of the mirror device MD. This support structure may also be used to support other optical elements of the projection system PS.

The support structure comprises a base frame BF which is arranged on a floor surface FS, for example a factory floor. The base frame BF supports a force frame FFR supporting the mirror device MD. A first vibration isolation system VIS-BF is arranged between the base frame BF and the force frame FFR to isolate the force frame FFR, at least partly, from vibrations of the base frame BF, for instance caused by vibration of the floor surface FS.

The base frame BF further supports an intermediate frame IFR. A second vibration isolation system VIS-BI is arranged between the base frame BF and the intermediate frame IFR to isolate the intermediate frame IFR, at least partly, from vibrations of the base frame BF. The intermediate frame IFR is arranged to support a sensor frame SFR. On the sensor frame SFR one or more sensors SEN are arranged to provide a sensor signal representative for a position of the mirror device MD with respect to the sensor frame SFR. The sensor signal is fed to a control unit CU which is arranged to control a mirror device actuator MACT to control a position of the mirror device MD. The mirror device actuator MACT is arranged between the mirror device MD and a reaction mass RM, which in it turn is supported on the force frame FFR.

The first vibration isolation system VIS-BF and the second vibration isolation system VIS-BI comprise air mounts.

It is remarked that, in practice, multiple support structures as shown in FIG. 2 may be used to support the mirror device, for instance at different frame corners of the mirror device MD. These support structures may be arranged on a single base frame BF or on different base frames BF. Correspondingly multiple support structures may be used to support the sensor frame SFR.

Between the sensor frame SFR and the intermediate IFR a third vibration isolation system VIS-IS is arranged. This third vibration isolation system VIS-IS may be arranged in a vacuum environment VAC. In such vacuum environment VAC, air mounts cannot be used. The vibration isolation between the sensor frame SFR and the intermediate frame IFR may require, in practice, a mechanical cut-off frequency of less than 5 Hz, for example 2 Hz. Due to a low modal mass caused by a relatively light-weight mass of the intermediate frame IFR, a low stiffness of the vibration isolation system VIS-IS is required, for example a stiffness of less than 5e4 N/m, for instance about 2e4 N/m.

According to an embodiment of the invention, the third vibration isolation system VIS-IS comprises a bearing device comprising a magnetic gravity compensator MGC and an actuator device ACT. The magnetic gravity compensator MGC comprises a first permanent magnet assembly PMA1 mounted with a first holding frame HFR1 to the sensor frame SFR the intermediate frame IFR and a second permanent magnet assembly PMA2 mounted with a second holding frame HFR2 to the intermediate frame IFR.

Figure 3:
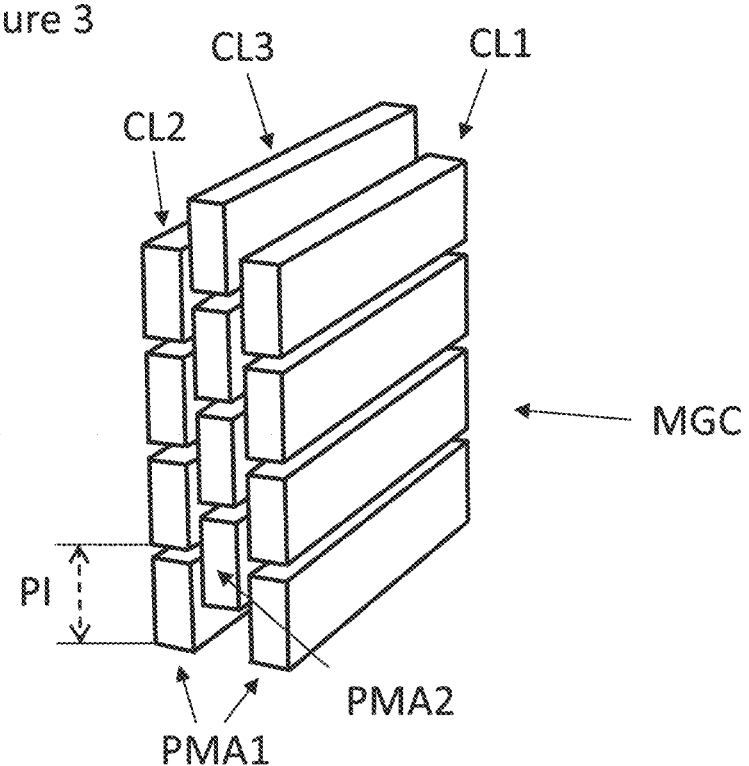
FIG. 3 shows a perspective view of a magnetic gravity compensator according to an embodiment of the invention.

FIG. 3 shows the magnetic gravity compensator MGC of the third vibration isolation system VIS-IS of FIG. 2 in more detail. The first permanent magnet assembly PMA1 comprises a first column CL1 of four permanent magnet bars and a second column CL2 of four permanent magnet bars. The first column CL1 and the second column CL2 extend parallel to each other in the vertical direction, and are arranged at the same height. The permanent magnet bars of the first column CL1 and the second column CL2 are mechanically linked to each other, for example by the first holding frame HFR 1, as shown in FIG. 2, to form the first permanent magnet assembly PMA1. It is remarked that, in an alternative embodiment, each column of permanent magnet bars may have its own holding frame with which the permanent magnet bars are mounted on the sensor frame SFR.

The second permanent magnet assembly PMA2 comprises a third column CL3 of four permanent magnet bars. The third column CL3 extends in a vertical direction and is arranged, at least partly, between the first column CL1 and the second column CL2. The permanent magnet bars of the third column CL3 are mechanically linked to each other, for example by the second holding frame HFR 2, as shown in FIG. 2, to form the second permanent magnet assembly PMA2.

The permanent magnets within the first, second and third columns CL1, CL2, CL3 are spaced with respect to each other with a pitch PI. The pitch PI between the adjacent permanent magnet bars in the same column is constant. Also, the pitches PI of the permanent magnets of different columns CL1, CL2, CL3 are the same. Furthermore, the third column CL3 is arranged in a vertical position with respect to the first and second column shifted over a distance corresponding with or close to a half of the pitch PI, i.e. a center point of the permanent magnet of the third column CL3 is at substantially the same height as the gap between two vertically adjacent permanent magnet bars of the first column CL1 and the second column CL2, respectively. In practice, the position of the third column CL3 may be offset with respect to exactly halfway of the pitch PI of the permanent magnets to optimize the stiffness of the magnetic gravity compensator MGC and/or the weight carried by the magnetic gravity compensator MGC. This offset position, which may for example be in the order of a few mm compared with a height dimension of more than 10 mm, typically more than 20 mm of each of the permanent magnet bars is regarded to be corresponding with or close to a half of the pitch PI.

Figure 4:
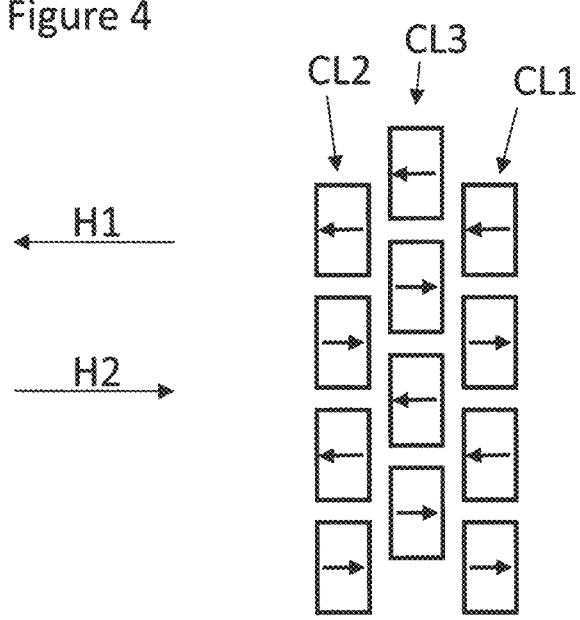
FIG. 4 shows a side view of the magnetic gravity compensator of FIG. 3.

FIG. 4 shows the polarization of the permanent magnet bars of the first column CL1, the second column CL2 and the third column CL3. From top to bottom, the first and third permanent magnet bars of the first column CL1 and the second column CL2 have a polarization direction in a first horizontal direction H1 and the second and fourth permanent magnet bars of the first column CL1 and the second column CL2 have a polarization direction in a second horizontal direction H2, wherein the second horizontal direction H2 is opposite to the first horizontal direction H1. The first horizontal direction H1 and the second horizontal direction H2 are both perpendicular to a third horizontal direction which is parallel to a longitudinal axis of the permanent magnet bars.

In the third column CL3, from top to bottom, the first and third permanent magnet bars have a polarization direction in the first horizontal direction H1 and the second and fourth permanent magnet bars have a polarization direction in the second horizontal direction H2.

Thus, the polarization direction of permanent magnet bars of the first column CL1 and the second column CL2 arranged at the same height are the same. The permanent magnet bars of the third column CL3 in a shifted positon of approximately a half pitch PI in vertical upwards direction also have the same polarization direction. It is remarked that in an embodiment in which the first permanent magnet assembly PMA1 would be mounted to the intermediate frame IFR and the second permanent magnet assembly PMA2 would be mounted to the sensor frame SFR, the polarization direction of the permanent magnet bars of the third column CL3 would be reversed, i.e. from top to bottom, the first and third permanent magnet bars of the third column C3 would have a polarization direction in the second horizontal direction H2 and the second and fourth permanent magnet bars would have a polarization direction in the first horizontal direction H1.

The design of the magnetic gravity compensator MGC according to the invention provides a ratio between payload, i.e. weight supported by the magnetic gravity compensator MGC, and stiffness of the magnetic gravity compensator MGC that may be substantially larger, for example 10 times, or even more than 15 times, for instance 20 times than know embodiments of magnetic gravity compensators, such as for example disclosed in US 2005/002008 A1, the contents of which are herein incorporated by reference, in its entirety.

In the design of a magnetic gravity compensator MGC, a negative stiffness may remain in some degrees of freedom, where a small positive stiffness is required.

The achievable positive stiffness has a lower bound since damping needs to be added to create a stable system. Typically, the minimum achievable positive stiffness with a servo control loop is two times the absolute value of the negative stiffness. As discussed above, in some applications it is desirable to have a positive stiffness of less than 5e4 N/m. This means that the maximum allowable negative stiffness is −2.5e4 N/m. Since in the design of the magnetic gravity compensator MGC, this low stiffness requirement may be critical, the operating point in the vertical direction is determined by this stiffness requirement. The operating point in the vertical direction is the relative vertical position of the first permanent magnet assembly PMA1 with respect to the second permanent magnet assembly PMA2 resulting in the offset with respect to a shifted position exactly halfway of the pitch PI of the permanent magnet bars. This means that the vertical shift of the third column CL3 with respect to the first column CL1 and the second column CL2 may be adjusted to optimize the stiffness of the magnetic gravity compensator within a range close to exactly halfway between two permanent magnet bars of the first column CL1 and the second column CL2.

As the vertical position is used to optimize the stiffness of the magnetic gravity compensator MGC, the vertical lifting force may be optimized in another way. The vertical lifting force of the magnetic gravity compensator MGC may for example be optimized by changing, in the design of the magnetic gravity compensator MGC, the distance between the third column CL3 and the first column CL1 and/or the second column CL2.

However, there may always remain a mismatch between the vertical lifting force provided by the magnetic gravity compensator MGC and the mass carried by the magnetic gravity compensator MGC. To compensate this potential mismatch the third vibration isolation system VIS-IS of FIG. 2 comprises the actuator device ACT. Furthermore, the actuator device ACT may also be needed for other reasons such as damping, position control, or the servo-controlled stabilization as mentioned above.

FIG. 5 shows a first embodiment of the third vibration isolation system VIS-IS comprising the combination of a magnetic gravity compensator MGC and the actuator device ACT. The actuator device ACT may for example be a Lorentz actuator or a reluctance actuator which is mounted, next to the magnetic gravity compensator MGC, between the sensor frame SFR and the intermediate frame IFR. The magnetic gravity compensator MGC has the same design as shown in FIGS. 3 and 4, but may also have any other suitable design.

The actuator device ACT only has to be constructed to provide a relatively small vertical lifting force compared with the total weight carried by the third vibration isolation system VIS-IS, since most of the weight, for example more than 95%, for instance 98% to 100% of the sensor frame SFR may be carried by the magnetic gravity compensator MGC.

The Lorentz actuator or the reluctance actuator may have any suitable design such as circular design, a rotational symmetric circular design or a multipole design. In the design of a reluctance actuator, care has to be taken with respect to parasitic stiffnesses. Flux feedback may be required to meet the low stiffness, linearity and hysteresis demands in this design.

FIG. 6 shows a second embodiment of the third vibration isolation system VIS-IS comprising the magnetic gravity compensator MGC and the actuator device ACT. The actuator ACT is a DC actuator comprising four coils COI arranged at opposite sides of the magnetic gravity compensator MGC. The permanent magnets of the first column CL1 and the second column CL2 of the first permanent magnet assembly PMA1 are used as mover magnets for the DC actuator. This way, no additional magnets are required to create the additional lifting force to obtain a positive stiffness. An advantage of this integrated design of magnetic gravity compensator MGC and actuator ACT are that a smaller construction volume is required for these two devices. Furthermore, total magnet costs are reduced since a lower number of magnets is required as no separate magnets for the actuator ACT are required.

FIG. 7 shows a third embodiment of the third vibration isolation system VIS-IS. In this third embodiment, additional stiffness is provided by a mechanical spring MS instead of the actuator device ACT. The mechanical spring MS is mounted next to the magnetic gravity compensator MGC between the intermediate frame IFR and the sensor frame SFR. The mechanical spring MS only has to provide a small vertical lifting force, since most of the weight of the sensor frame SFR is carried by the magnetic gravity compensator MGC. As a result, the mechanical spring MS can be designed with a very low, but sufficient stiffness to provide, in combination with the stiffness of the magnetic gravity compensator MGC a small positive stiffness. It is remarked that the spring may also be used to adjust the position of the frame carried by the spring by means of a relatively small compression or relaxation of the spring.

Hereinabove, a magnetic gravity compensator MGC has been disclosed with a specific construction comprising a first column CL1, a second column CL2 and a third column CL3 of four permanent magnets. The first column CL1 and the second column CL2 are part of a first permanent magnet assembly PMA1 connected to a first part of an apparatus, in particular a lithographic apparatus, and the third column CL3 is part of a second permanent magnet assembly PMA2 connected to a second part of an apparatus, in particular a lithographic apparatus. The first column CL1, second column CL2 and third column CL3 each extend, parallel to each other, in the vertical direction, wherein the permanent magnets of the first column CL1, second column CL2 and third column CL3 have a polarization direction in either a first horizontal direction H1 or in a second horizontal direction H2 opposite to the first horizontal direction H1. Vertically adjacent permanent magnets within each column CL1, CL2, CL3 have opposite polarization directions.

The permanent magnet bars of the second permanent magnet assembly PMA2 having the same polarization direction as the permanent magnet bars of the first permanent magnet assembly PMA1 are in a shifted positon of approximately a half pitch PI in vertical upwards direction, if the second part of the apparatus supports the weight of the first part of the apparatus. If the first part is arranged to support the weight of the second part, the permanent magnet bars of the second permanent magnet assembly PMA2 having the same polarization direction as the permanent magnet bars of the first permanent magnet assembly PMA1 may be arranged in a shifted positon of approximately a half pitch PI in vertical downwards direction.

In alternative embodiments, the columns of permanent magnets may have any other number of one or more permanent magnets within each column, and/or different columns may comprise a different number of magnets. Furthermore, the first permanent magnet assembly PMA1 of the magnetic gravity compensator MGC may have one or more further columns with permanent magnets and the second permanent magnet assembly PMA2 may have an equal number of further columns with permanent magnets, wherein the further column of the second permanent magnet assembly PMA2 is arranged, at least partly, between two columns of permanent magnets of the first permanent magnet assembly PMA1.

Figure 8:
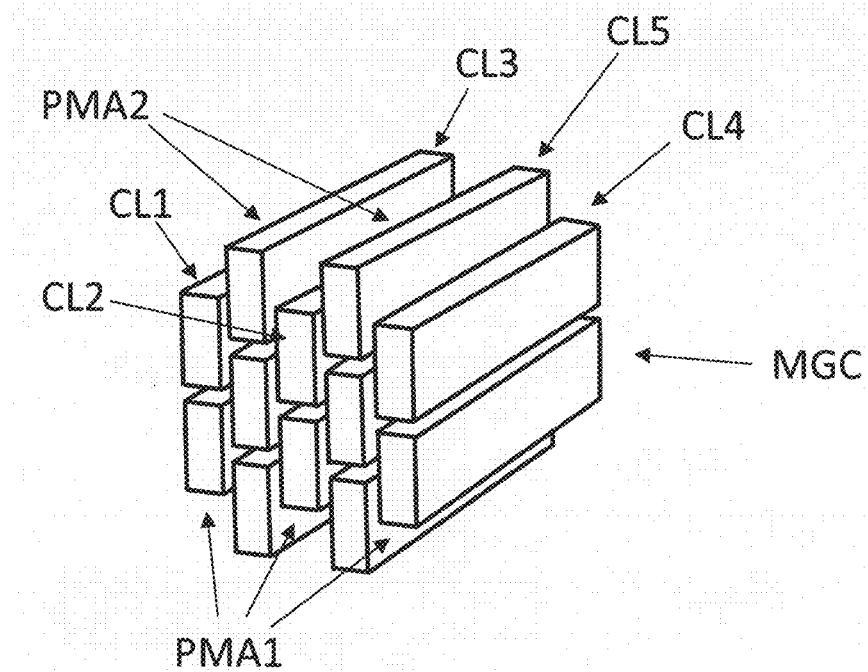
FIG. 8 shows a perspective view of a magnetic gravity compensator according to an alternative embodiment of the invention.
Figure 9:
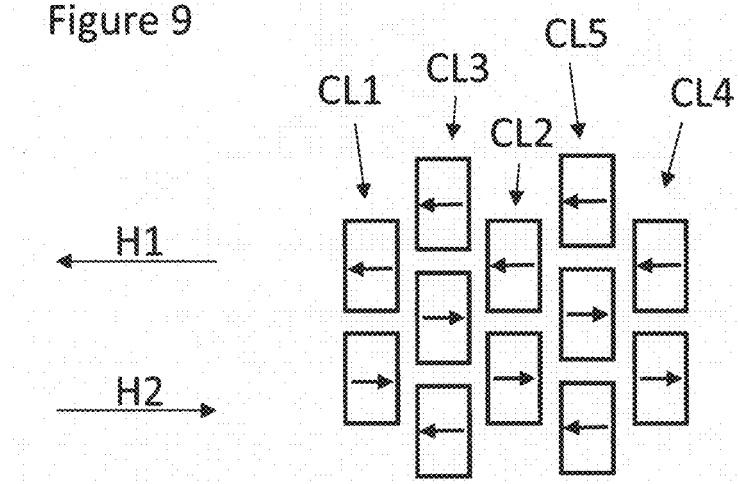
FIG. 9 shows a side view of the magnetic gravity compensator of FIG. 8.

FIGS. 8 and 9 show an alternative embodiment of a magnetic gravity compensator MGC. The magnetic gravity compensator MGC of FIGS. 8 and 9 comprises a first permanent magnet assembly PMA1 having a first column CL1, a second column CL2 and a further column CL4 with each column having two permanent magnets bars arranged above each other. The permanent magnet bars of the first column CL1, the second column CL2 and the further column CL4 are mechanically linked to each other, for example by a holding frame (not shown) to form the first permanent magnet assembly PMA1.

The second permanent magnet assembly PMA2 comprises a third column CL3 and a second further column CL5, each comprising three permanent magnet bars. The third column CL3 is arranged between the first column CL1 and the second column CL2, and the second further column CL5 is arranged between the second column CL2 and the further column CL4.

Corresponding with the embodiment of FIGS. 3 and 4, the polarization direction of the permanent magnets is the first horizontal direction H1 or the second horizontal direction H2, opposite to the first horizontal direction H1, as shown in FIG. 9. Vertically adjacent permanent magnets within each of the first column CL1, the second column CL2, the third column CL3, the further column CL4 and the second further column CL5 have opposite polarization directions in the first horizontal direction or the second horizontal direction.

The permanent magnet bars of the second permanent magnet assembly PMA2 having the same polarization direction as the permanent magnet bars of the first permanent magnet assembly PMA1 are in a shifted positon of approximately a half pitch in vertical upwards direction. This configuration is suitable to support a first part of an apparatus mounted to the first permanent magnet assembly PMA1 with a second part of the apparatus mounted to the second permanent magnet assembly PMA2. If the first part is arranged to support the weight of the second part, the permanent magnet bars of the second permanent magnet assembly PMA2 having the same polarization direction as the permanent magnet bars of the first permanent magnet assembly PMA1 may be arranged in a shifted positon of approximately a half pitch PI in vertical downwards direction.

It will be clear that many different configurations of the first permanent magnet assembly PMA1 and second permanent magnet assembly PMA2 are possible.

Further, it is remarked that the permanent magnet bars may have any suitable dimensions. The permanent magnet bars may be straight or curved. For example a circular configuration may be based on the above described concept of the magnetic gravity compensator MGC, whereby the permanent magnet bars extend in a circular direction.

The vibration isolation system according to the invention may be applied at any suitable location.

As explained with respect to the embodiment shown in FIG. 5, the actuator device ACT is provided to compensate a mismatch between the vertical lifting force provided by the magnetic gravity compensator MGC and the mass carried by the magnetic gravity compensator MGC. The actuator device ACT may also be used for damping, position control, and/or for stabilization of the third vibration isolation system VIS-IS.

Further, the magnetic gravity compensator MGC may have negative stiffness in some or all directions. This means that the magnetic gravity compensator MGC is by itself unstable and needs to be stabilized by control.

Figure 10:
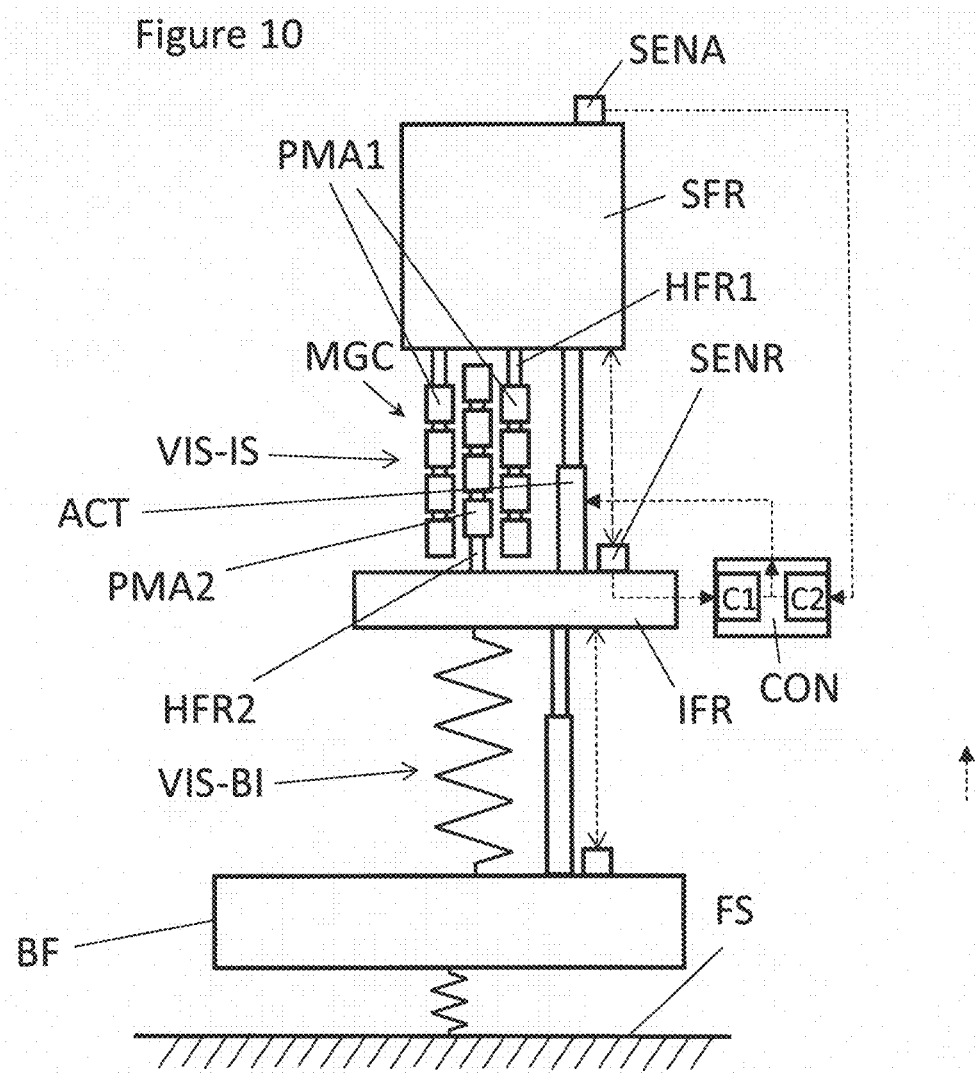
FIG. 10 shows a control structure for the vibration isolation system shown in FIG. 5.

FIG. 10 shows a control system to control the actuator ACT.

A position sensor SENR is arranged to measure a distance between the intermediate frame IFR and the sensor frame SFR. The position SENR provides, as an output signal, a first sensor signal representative for the distance between the intermediate frame IFR and the sensor frame SFR. Further, an acceleration sensor SENA is provided on the sensor frame SFR to measure an acceleration of the sensor frame SFR. The acceleration sensor SENA provides, as an output signal, a second sensor signal representative for the acceleration of the sensor frame SFR.

It is remarked that the first sensor signal relates to a relative measurement, i.e. distance between intermediate frame IFR and sensor frame SFR, while the second sensor signal relates to an absolute measurement, i.e. acceleration of the sensor frame SFR.

The controller CON comprises a first sub-controller C1 and a second sub-controller C2. The first measurement signal is fed into the first sub-controller C1 and the second measurement signal is fed into the second sub-controller C2. The outputs of the first sub-controller C1 and the second sub-controller S2 are combined and used as an actuator signal to drive the actuator ACT.

By using the combination of relative control, using the position sensor SENR and the first sub-controller C1, and absolute control, using the acceleration sensor SENA and the second sub-controller C2, the control performance can be improved. In particular, with this combination of relative and absolute control the suspension frequency can be reduced and vibration isolation can be improved when compared to using only relative control.

When only a relative position measurement between sensor frame SFR and intermediate frame IFR is used, a certain minimum control gain and damping is required to stabilize the magnetic gravity compensator MGC. Typically, the resulting suspension frequency is 3× the "negative" suspension frequency provided by the magnetic gravity compensator MGC. For example, a gravity compensator having a positive stiffness k will have a suspension frequency of sqrt(k/m), wherein m is the mass. But a gravity compensator MGC having a negative stiffness −k will have a (controlled) suspension frequency of 3·sqrt(k/m). The vibration isolation for higher frequencies is then 32=9× worse than for the positive stiffness gravity compensator with the same but opposite stiffness.

For example, when only relative control is used, which means that the second sub-controller C2 is not used, the first sub-controller C1 needs to stabilize the negative stiffness of the magnetic gravity compensator MGC and therefore must provide a control stiffness which is larger than the negative stiffness of the magnetic gravity compensator MGC.

To obtain stability, a derivative action is then required of which the lowest feasible frequency equals the negative suspension frequency of the magnetic gravity compensator MGC. The closed-loop suspension frequency will be minimally three times this negative suspension frequency in order to create sufficient phase margin.

In addition to stabilization, the controller CON, in particular the sub-controller C1 needs to contain a low-bandwidth integrator for positioning of the sensor frame SFR. As a consequence, when only relative control is used, the suspension frequency of the magnetic gravity compensator MGC is limited to no less than three times the negative suspension frequency based on the negative stiffness. This is a limit to the performance of the vibration isolation system.

The controller CON as shown in FIG. 10 may improve the performance of the control of the third vibration isolation system VIS-IS by the following control design steps:
1. Use the relative control, i.e. sub-controller C1, mainly to add stiffness to the third vibration isolation system VIS-IS and, if needed, some low-pass filtering and positioning integrator. In this relative control loop, the closed-loop system should behave as an undamped resonance by creating exactly −180 degrees phase shift at bandwidth.
2. Damp the now-arising resonance by means of an acceleration feedback loop based on the acceleration sensor SENA and the second sub-controller C2.

Figure 11:
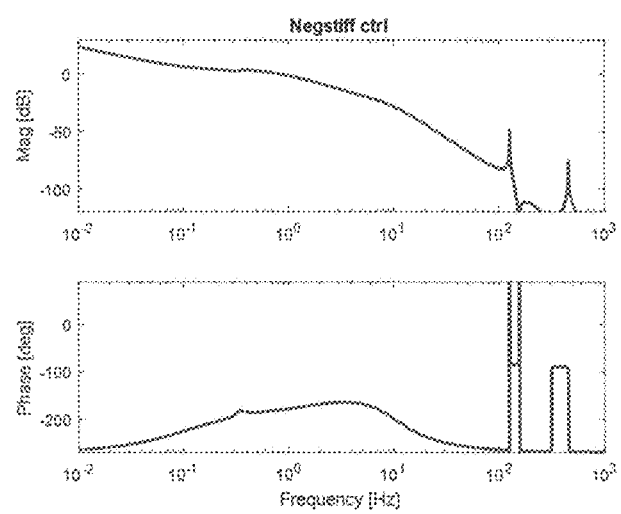
FIG. 11 shows a bode plot of a relative control loop for the design of a controller.

FIG. 11 shows a Bode plot of the relative position loop used to create an undamped resonance. It can be seen that at 1 Hz, the original negative suspension frequency, the phase is tuned to exactly −180 degrees to create a closed-loop resonant system. The now occurring resonance can be damped in a conventional way by an active damping loop using the second sub-controller C2 having the acceleration of the sensor frame as input signal.

This way of controlling a position of a sensor frame SFR suspended by a gravity compensator, in particular a magnetic gravity compensator MGC having a negative stiffness, allows a suspension frequency which is roughly equal to the negative suspension frequency. This creates an improved transmissibility from floor to sensor frame.

Figure 12:
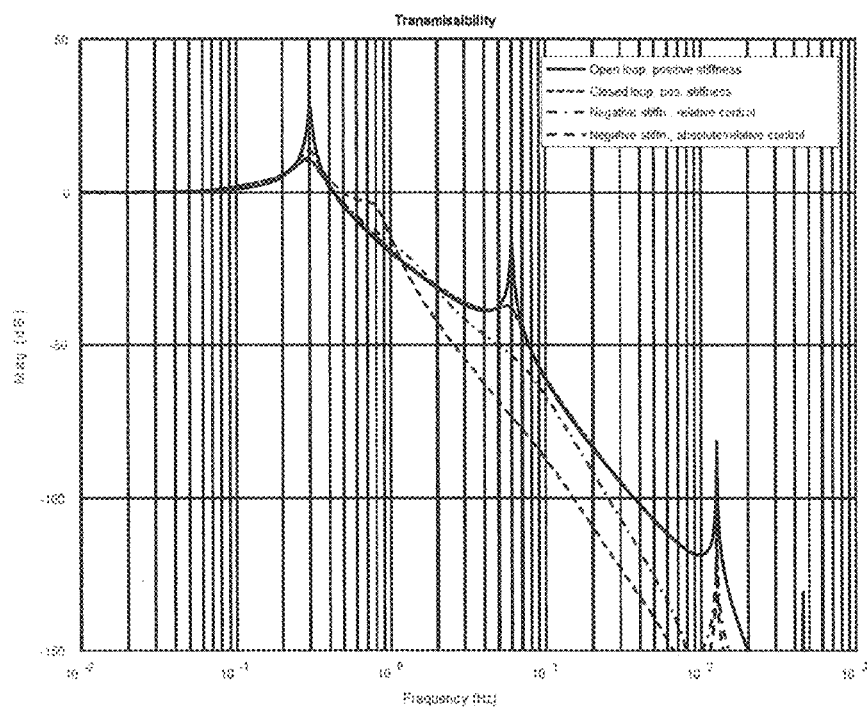
FIG. 12 shows transmission curves for a bearing device with positive stiffness, open loop and closed loop and with negative stiffness using relative position control and a combination of relative and absolute control.

FIG. 12 shows four transmissibility curves for comparison. In particular, FIG. 12 shows one curve for a positive stiffness with 6 Hz suspension frequency without control, one curve for a positive stiffness with 6 Hz suspension frequency with active damping control, one curve for a negative stiffness of −8e4 N/m ("−1 Hz"), with relative control, resulting in a "3 Hz like" performance, and one curve for a negative stiffness of −8e4 N/m ("−1 Hz"), with the combination of relative and absolute control as proposed above, resulting in a "1 Hz like" performance.

A considerable improvement is shown for control of the magnetic gravity compensator MGC having a negative stiffness using a combination of absolute and relative control when compared with only relative control. At 10 Hz, the relative control method performs 6 dB, or 2×, better than the positive-stiffness case, due to the 3 Hz closed-loop suspension frequency compared to 6 Hz positive-stiffness frequency. The control method using a combination of relative control and absolute control improves this by an extra 20 dB, or 10×, which matches the "effective" suspension frequency of 1 Hz compared to 3 Hz.

FIGS. 13 and 14 show an alternative embodiment of a magnetic gravity compensator MGC according to an embodiment of the invention. FIG. 13 shows a top view of this magnetic gravity compensator MGC and FIG. 14 shows a cross section A-A of the magnetic gravity compensator MGC.

The magnetic gravity compensator MGC comprises a first permanent magnet assembly having a first column CL1 of permanent magnets and a second permanent magnet assembly having a second column CL2 of permanent magnets. The permanent magnets of the first column CL1 have an annular shape. Similarly, the permanent magnets of the second column CL2 have an annular shape. The outer diameter of the permanent magnets of the second column CL2 is smaller than the inner diameter of the permanent magnets of the first column CL1. The longitudinal axes of the first column CL1 and the second column CL2 are arranged coincident with each other, whereby the permanent magnets of the first column CL1 enclose the permanent magnets of the second column CL2.

The polarization direction of the permanent magnets of the magnetic gravity compensator MGC of both the first column CL1 and the second column CL2 is either a radially inwards direction R1 with respect to the annular shape of the permanent magnets or a radially outwards direction R2 with respect to the annular shape of the permanent magnets. The vertically adjacent permanent magnets of the first column CL1 have opposite polarization directions in the radially inwards direction R1 and the radially outwards direction R2. Correspondingly, the vertically adjacent permanent magnets of the second column CL2 have opposite polarization directions in the radially inwards direction R1 and the radially outwards direction R2.

The first permanent magnet assembly may be connected to a first part of an apparatus, in particular a lithographic apparatus, and the second permanent magnet assembly may be connected to a second part of an apparatus, in particular a lithographic apparatus. For example, the magnetic gravity compensator MGC may be provided between a sensor frame and an intermediate frame (see FIG. 2), whereby the first permanent magnet assembly is mounted on the intermediate frame IFR and the second permanent magnet assembly is mounted on the sensor frame SFR.

The magnetic gravity compensator MGC of FIGS. 13 and 14 is designed to be less sensitive to magnetic cross talk. Due to the use of relatively large permanent magnets in a magnetic gravity compensator, the magnetic gravity compensator may be sensitive to a disturbance force, i.e. magnetic cross talk, acting on the permanent magnets of the magnetic gravity compensator. This disturbance force may disturb functioning/performance of a sensitive object, such as a mirror device, sensor device or substrate table. In particular when the permanent magnet assemblies behave as dipoles, the magnetic gravity compensator may become sensitive to magnetic cross-talk and become a strong emitter of a magnetic stray field that may have a disturbing effect on an E-beam of an electron beam device and/or a magnetically sensitive sensor signal. Thereby, the field of a dipole has a relatively slow decay as function of the distance from the dipole resulting in a relative large area being sensitive for the effects of the magnetic cross-talk.

The design of the magnetic gravity compensator MGC of FIGS. 13 and 14 is aimed at avoiding that the permanent magnet assemblies of the magnetic gravity compensator MGC behave as a magnetic dipole. The permanent magnets of the magnetic gravity compensator have an annular shape with a polarization direction radially inwards (R1) or radially outwards (R2) with respect to the annular shape. As shown in FIG. 15, such configuration is approximately magnetically equivalent to two annular magnets with opposite polarization directions in longitudinal direction, i.e. two opposing dipoles. When observed from a distance which is considerably larger than the distance between the opposing dipoles, for example the distance from a long stroke actuator coil to a substrate table or mirror device, the opposing dipoles are effectively on top of each other. As a result, the opposing dipoles have an opposite effect by which the electromagnetic crosstalk is effectively cancelled, or at least substantially reduced.

It has been found that the cross-talk performance of the permanent magnet assemblies may for example be improved with a factor 5 to 200 with respect to the sensitivity to magnetic fields of external actuators, such as a long stroke actuator coil, but also with respect to the effects of emitted stray fields by the permanent magnets to the surroundings of the magnetic gravity compensator MGC, for example performance of magnetically sensitive sensors and/or electron beam applications.

Therefore, the design of the magnetic gravity compensator MGC as shown in FIGS. 13 and 14 is in particular useful in applications where magnetic cross-talk should be reduced.

In other embodiments, the magnetic gravity compensator MGC may have further annular shaped columns of permanent magnets that may be arranged within or around the first column CL1 and the second column CL2 shown in FIGS. 13 and 14. Also, each of the first column CL1 and the second column CL2 may be provided with more permanent annular shaped permanent magnets than the number shown in FIGS. 13 and 14.

FIG. 16 shows an embodiment of a mechanical spring SP configured to support a mass in a support direction, typically the vertical direction, with respect to a support. The mass is for example a frame, such as a sensor frame SFR or a force frame FFR and the support is for example an intermediate frame IFR or base frame BF, respectively. Mechanical springs are commonly applied as support devices, i.e. to support a mass with respect to a support.

The spring SP, or a combination of these springs SP, may be used as a support device, whereby a mass is only supported by this spring SP or the combination of springs SP. In alternative embodiments, the spring SP may be used in combination with another supporting device or element, for example a magnetic gravity compensator MGC as shown in FIG. 7 to form a support device.

The spring SP, as shown in FIG. 16, is in particular suitable to be used in a vibration isolation system. When a spring SP is applied in a vibration isolation system a number of constraints should be taken into account in the design of the spring SP.

A first constraint is that the spring SP should be able to carry the desired payload, for example the mass of the object supported by the spring, or a respective part thereof. A second constraint is that the spring should have a low stiffness to obtain a low rigid body mode frequency. A third constraint for a spring design of a spring to be used in a vibration isolation system is that the internal modes of the spring should be high. A fourth constraint is that the spring should have sufficient strength under lateral loads, i.e. forces exerted in a direction perpendicular to the support direction of the spring.

The spring SP as shown in FIG. 16 is specifically designed in view of these four constraints.

The spring SP comprises an upper support element USE and a lower support element LSE. The upper support element USE and the lower support element LSE are ring elements that are provided to mount the spring SP to the mass to be supported and to the support. For example, the upper support element USE may be mounted on the force frame FFR and the lower support element LSE may be mounted to the base frame BF. The upper support element USE and the lower support element LSE may have any shape suitable to mount the spring SP on the respective mass and the respective support. Preferably, the upper support element USE and the lower support element LSE are ring shaped or disc shaped and may be arranged concentrically with a longitudinal axis of the spring SP.

In the embodiment shown in FIG. 16, one helix element HE is provided between the upper support element USE and the lower support element LSE. The helix element HE extends substantially helically between the upper support element USE and the lower support element LSE. It is remarked that in the spring SP shown in FIG. 16 only one helix element HE is provided between the upper support element USE and the lower support element LSE. In practice, two or more helix elements HE may be provided between the upper support element USE and the lower support element LSE. These two or more helix elements HE may evenly be distributed over the circumference of the upper support element USE and the lower support element LSE.

The helix element HE comprises a cross section that decreases from the upper support element USE towards a midpoint MP of the helix element HE and increases again from the midpoint MP towards the lower support element LSE. The midpoint MP is halfway between the lower support element LSE and the upper support element USE.

FIGS. 17 and 18 show cross sections of the helix element HE. The cross section A-A, shown in FIG. 17, is a cross section relatively close to the midpoint MP of the helix element HE, while the cross section B-B, shown in FIG. 18 is a cross-section further away from the midpoint MP of the helix element HE. The cross sections A-A and B-B each have a rectangular shape with a width and a height. The cross section A-A has a width b1 and a height h1. The cross section BB has a width b2 and a height h2. The height h1 and the height h2 are the same, but the width b2 is substantially larger than the width b1. The height direction in which the height dimension extends is the support direction of the spring SP. This support direction usually corresponds with the vertical direction. The width direction is a radial direction with respect to the longitudinal axis of the spring SP.

The height h1, h2 of the cross section of the helix element HE is, at least over a large part of the helix element HE substantially larger than the width b1, b2 of the cross section. This relatively large dimension in the support direction of the spring SP provides a high bending stiffness about the width direction of the cross section. This advantageously uses the material of the helix element HE to support the mass supported by the spring SP, while at the same time the total mass of the helix element HE is kept relatively low. This relative low mass positively increases the internal modes of the spring SP.

The size of the cross section of the helix element HE at the midpoint MP is selected such that the spring SP provides sufficient strength to support the mass mounted on the spring SP. The gradually increasing size of the cross section of the helix element HE from the midpoint MP towards the upper support element USE and from the midpoint MP towards the lower support element LSE, maintains the stress level in the helix element HE below a maximally allowable stress level.

Due to the length of the helix elements HE, the spring SP also provides a low stiffness to obtain a low rigid body mode frequency.

It is remarked that when the spring SP would be provided with two or more helix elements HE, these two or more helix elements HE preferably have the same design and dimensions. For example, in the embodiment of FIG. 16, four or five helix elements of the same design as the helix element HE shown in FIG. 16 could be distributed over the circumference of the upper support element USE and the lower support element LSE, such that these helix elements run helically and parallel to each other extend between the upper support element USE and the lower support element LSE. The provision of two or more helical elements HE distributed over the circumference of the spring will result in a more symmetrical behavior of the spring SP, which is generally desirable.

Figure 19:
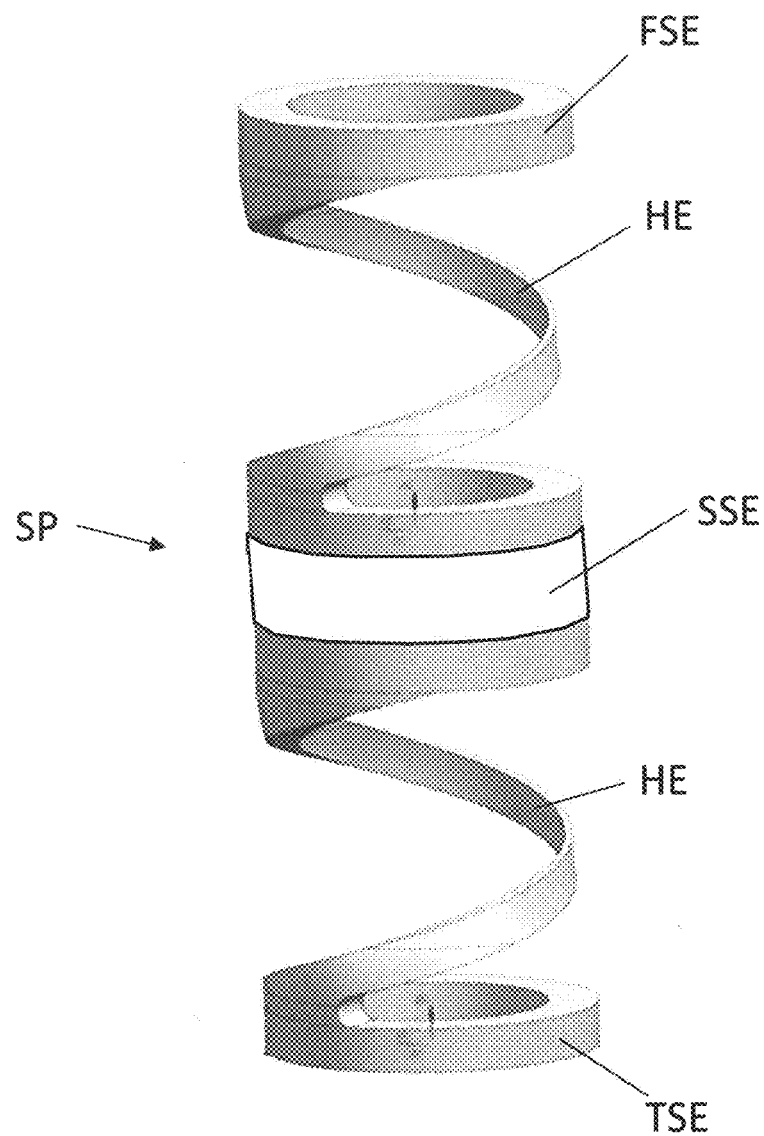
FIG. 19 shows an alternative embodiment of a spring according to an aspect of the invention.

FIG. 19 shows an alternative embodiment of a spring SP to be applied in a vibration isolation system. The spring SP comprises a first support element FSE, a second support element SSE and a third support element TSE. The second support element SSE is mounted on the mass to be supported, while the first support element FSE and the third support element TSE are mounted on the support.

Between the first support element FSE and the second support element SSE a helix element HE is provided. Also, between the second support element SSE and the third support element TSE a helix element HE are provided. The helix elements HE may be designed the same as described above with respect to the embodiment of FIG. 16.

In this embodiment, both the helix element HE between the first support element FSE and the second support element SSE and the helix element HE between the second support element SSE and the third support element TSE are used to support the mass with respect to the support.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A bearing device arranged to support in a vertical direction a first part of an apparatus with respect to a second part of the apparatus, the bearing device comprising a magnetic gravity compensator, wherein the magnetic gravity compensator comprises:

a first permanent magnet assembly mounted to one of the first part and the second part and comprising at least a first column of permanent magnets, the first column extending in a vertical direction, wherein the permanent magnets have a polarization direction in a first horizontal direction or in a second horizontal direction opposite to the first horizontal direction, wherein vertically adjacent permanent magnets have opposite polarization directions, and a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction, wherein:
the first permanent magnet assembly at least partially encloses the second permanent magnet assembly;
the first part comprises a sensor frame; and
the second part comprises an intermediate frame configured to:
support the sensor frame; and
be supported by a base frame; and
the magnetic gravity compensator is configured to have a negative stiffness based on a combination of absolute control and relative control of an actuator.

2. The bearing device of claim 1,
wherein the first permanent magnet assembly comprises the first column of permanent magnets and a second column of permanent magnets, the second column extending in the vertical direction, parallel to the first column of permanent magnets, wherein the permanent magnets of the second column have a polarization direction in the first horizontal direction or in the second horizontal direction,
wherein vertically adjacent permanent magnets of the second column have opposite polarization directions, and wherein permanent magnets of the first column and the second column arranged at the same height have the same polarization direction, and
wherein the at least one other column of permanent magnets comprises a third column of permanent magnets, the third column extending in the vertical direction, wherein the third column is arranged, at least partly, between the first column and the second column, wherein vertically adjacent permanent magnets of the third column have opposite polarization directions in the first horizontal direction or the second horizontal direction.

3. The bearing device of claim 1, wherein a pitch between vertically adjacent permanent magnets of the first column and the at least one other column is the same for each column, and wherein the at least one other column is arranged in a vertical position with respect to the first column and the at least one other column shifted over a distance substantially corresponding to a half of the pitch.

4. The bearing device of claim 1, wherein the bearing device further comprises an actuator device arranged to provide an additional vertical force between the first part and the second part of the apparatus.

5. The bearing device of claim 4, wherein the bearing device comprises:
 a first sensor arranged to provide a first measurement signal representative of a relative distance between the first part of the apparatus and the second part of the apparatus,
 a second sensor arranged to provide a second measurement signal representative of an acceleration of the first part of the apparatus, and
 a controller arranged to provide an actuator signal to drive the actuator device at least partially on the basis of the first measurement signal and the second measurement signal.

6. The bearing device of claim 4, wherein the actuator is configured to damp motion of the first part.

7. The bearing device of claim 4, wherein the actuator is configured to damp motion of the second part.

8. The bearing device of claim 4, wherein the actuator is configured to stabilize the bearing device.

9. The bearing device of claim 4, wherein the actuator is configured to adjust a position of the one of the first part and the second part supported by the bearing device.

10. The bearing device of claim 1, wherein the bearing device comprises a mechanical spring between the first part and the second part of the apparatus.

11. The bearing device of claim 1, wherein the bearing device is constructed as a vibration isolation system between the first part and the second part of the apparatus.

12. The bearing device of claim 1,
 wherein the permanent magnets of the first column have an annular shape, wherein the first horizontal direction is radially inwards of the annular shape and the second horizontal direction is radially outwards of the annular shape,
 wherein the permanent magnets of the other column have an annular shape, wherein the first horizontal direction is radially inwards of the annular shape and the second horizontal direction is radially outwards of the annular shape, and
 wherein an inner diameter of the permanent magnets of the first column is larger than an outer diameter of the permanent magnets of the at least one other column, and the at least one other column is at least partially arranged within the first column.

13. The bearing device of claim 1, wherein the permanent magnets of the second permanent magnet assembly having the same polarization direction as the permanent magnets of the first permanent magnet assembly are in a shifted position of approximately a half pitch in a vertical upwards direction when the first permanent magnet assembly is mounted to the first part and the second permanent magnet assembly is mounted to the second part, and the permanent magnets of the second permanent magnet assembly having the same polarization direction as the permanent magnets of the first permanent magnet assembly are in a shifted position of approximately a half pitch in a vertical downwards direction when the first permanent magnet assembly is mounted to the second part and the second permanent magnet assembly is mounted to the first part.

14. A magnetic gravity compensator, comprising:
 a first permanent magnet assembly mounted to one of a first part and a second part and comprising at least a first column of permanent magnets, the first column extending in a vertical direction, wherein the permanent magnets have a polarization direction in a first horizontal direction or in a second horizontal direction opposite to the first horizontal direction, wherein vertically adjacent permanent magnets have opposite polarization directions; and
 a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction,
 wherein:
  the first permanent magnet assembly at least partially encloses the second permanent magnet assembly;
  the first part comprises a sensor frame; and
  the second part comprises an intermediate frame configured to:
   support the sensor frame; and
   be supported by a base frame; and
  the magnetic gravity compensator is configured to have a negative stiffness based on a combination of absolute control and relative control of an actuator.

15. A lithographic apparatus comprising:
 a support constructed to support a patterning device, the patterning device being capable of imparting to the radiation beam a pattern in its cross-section to form a patterned radiation beam;
 a substrate table constructed to hold a substrate;
 a projection system configured to project the patterned radiation beam onto a target portion of the substrate; and
 a bearing device arranged to support in a vertical direction a first part of the lithographic apparatus with respect to a second part of the lithographic apparatus,
 wherein:
  the bearing device comprises a magnetic gravity compensator;
  the magnetic gravity compensator comprises:
   a first permanent magnet assembly mounted to one of the first part and the second part and comprising at least a first column of permanent magnets, the first column extending in a vertical direction, wherein the permanent magnets have a polarization direction in a first horizontal direction or in a second horizontal direction opposite to the first horizontal direction, wherein vertically adjacent permanent magnets have opposite polarization directions, and
   a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction;

the first permanent magnet assembly at least partially encloses the second permanent magnet assembly;

the first part comprises a sensor frame; and the second part comprises an intermediate frame configured to:
 support the sensor frame; and
 be supported by a base frame; and the magnetic gravity compensator is configured to have a negative stiffness based on a combination of absolute control and relative control of an actuator.

16. The lithographic apparatus of claim 15, wherein the bearing device is arranged in a vacuum space of the lithographic apparatus.

17. A method to control a gravity compensator having a negative stiffness, and arranged between a first part of an apparatus and a second part of the apparatus, comprising:

generating, by a first sensor, a first measurement signal representative of a relative distance between the first part of the apparatus and the second part of the apparatus;

generating, by a second sensor, a second measurement signal representative of an acceleration of the first part of the apparatus;

receiving, by a first sub-controller of a controller, the first measurement signal;

receiving, by a second sub-controller of the controller, the second measurement signal;

generating, by the controller, an actuator signal to drive an actuator device arranged between the first part of the apparatus and the second part of the apparatus on the basis of the first measurement signal and the second measurement signal, wherein the gravity compensator is configured to have the negative stiffness based on a combination of absolute control and relative control of the actuator device;

using a sensor frame for the first part; and using an intermediate frame for the second part, the intermediate frame configured to:
 support the sensor frame; and
 be supported by a base frame.

18. A vibration isolation system comprising a bearing device arranged to support in a vertical direction a first part of an apparatus with respect to a second part of the apparatus, the bearing device comprising a magnetic gravity compensator, wherein the magnetic gravity compensator comprises:

a first permanent magnet assembly mounted to one of the first part and the second part and comprising at least a first column of permanent magnets, the first column extending in a vertical direction, wherein the permanent magnets have a polarization direction in a first horizontal direction or in a second horizontal direction opposite to the first horizontal direction, wherein vertically adjacent permanent magnets have opposite polarization directions, and a second permanent magnet assembly mounted to the other of the first part and the second part and comprising at least one other column of permanent magnets, the at least one other column extending in the vertical direction, wherein vertically adjacent permanent magnets of the at least one other column have opposite polarization directions in the first horizontal direction or the second horizontal direction, wherein:
 the first permanent magnet assembly at least partially encloses the second permanent magnet assembly;
 the first part comprises a sensor frame; and
 the second part comprises an intermediate frame configured to:
  support the sensor frame; and
  be supported by a base frame; and
 the magnetic gravity compensator is configured to have a negative stiffness based on a combination of absolute control and relative control of an actuator.

* * * * *

UNITED STATES PATENT AND TRADEMARK OFFICE
CERTIFICATE OF CORRECTION

PATENT NO. : 11,029,612 B2
APPLICATION NO. : 16/494200
DATED : June 8, 2021
INVENTOR(S) : Kimman et al.

Page 1 of 1

It is certified that error appears in the above-identified patent and that said Letters Patent is hereby corrected as shown below:

On the Title Page

Item (72), Inventors section before "Theodorus Mattheus" please insert --Alfred--.

Item (72), Inventors section after "Theodorus Mattheus" please delete "Joannus" and insert --Joannes--.

Signed and Sealed this
Third Day of May, 2022

Katherine Kelly Vidal
*Director of the United States Patent and Trademark Office*